US005524121A

United States Patent [19]

Nambu

[11] Patent Number: 5,524,121

[45] Date of Patent: Jun. 4, 1996

[54] DIGITAL DATA MODULATING METHOD

[75] Inventor: Mototoshi Nambu, Tokyo, Japan

[73] Assignee: SMK Corporation, Tokyo, Japan

[21] Appl. No.: 350,001

[22] Filed: Nov. 29, 1994

[30] Foreign Application Priority Data

Mar. 11, 1994 [JP] Japan .................................... 6-041038

[51] Int. Cl.$^{6}$ ........................................................ H03K 7/08

[52] U.S. Cl. ............................ 375/238; 375/295; 341/53; 332/109

[58] Field of Search .................................... 375/238, 239, 375/259, 295, 359, 282, 280, 283, 308, 289; 341/53; 332/109

[56] References Cited

U.S. PATENT DOCUMENTS 3,454,718 7/1969 Perreault ................................ 375/276

OTHER PUBLICATIONS

"NR/NRZI Data Modulation–Demodulation" IBM Technical Disclosure Bulletin, vol. 32 No. 5B, Oct. 1989 pp. 391–395.

*Primary Examiner*—Stephen Chin
*Assistant Examiner*—Tesfaldet Bocure
*Attorney, Agent, or Firm*—Nikaido, Marmelstein, Murray & Oram

[57] ABSTRACT

Disclosed is an improved digital data modulating method appropriate for stable and high-speed communication. It comprises the step of allotting each of N sequential digital data bit combinations to a corresponding period-and-phase discriminating signal, thereby providing a modulated signal in the form of a series of different single-periods, which modulated signal is insensitive to noise signals appearing in communication mediums.

2 Claims, 7 Drawing Sheets

FIG.1
| THREE SEQUENTIAL BIT CELLS | | | SINGLE-PERIOD MODULATED SIGNAL | |
|---|---|---|---|---|
| $b_i$ | $b_{i+1}$ | $b_{i+2}$ | T (PERIOD) | SP (STARTING POINT) |
| L | L | L | $T_S$ | S OF $b_{i+1}$ |
| L | L | H | $T_M$ | S OF $b_{i+1}$ |
| H | L | L | $T_M$ | C OF $b_i$ |
| H | L | H | $T_L$ | C OF $b_i$ |
| H | H | — | $T_S$ | C OF $b_i$ |
$T_S$: SHORT-PERIOD
$T_M$: INTERMEDIATE-PERIOD
$T_L$: LONG-PERIOD
S: LEADING END
C: INTERMEDIATE POINT
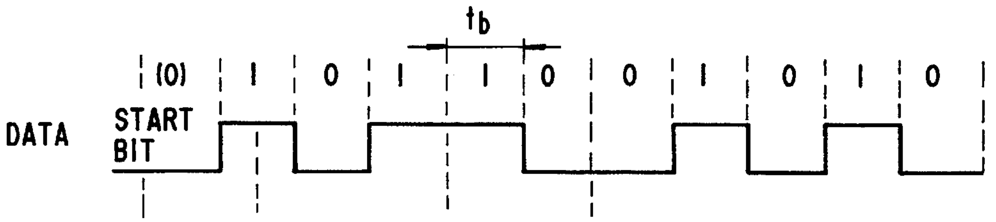
FIG.2A
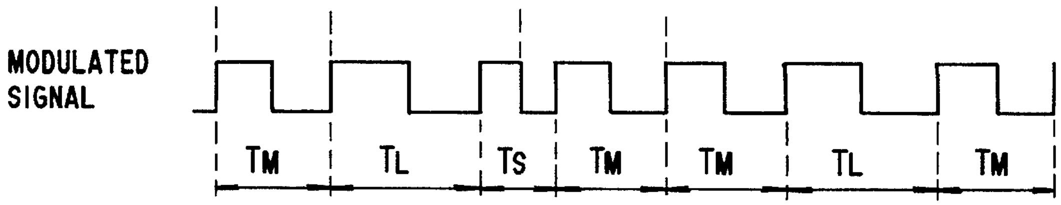
FIG.2B

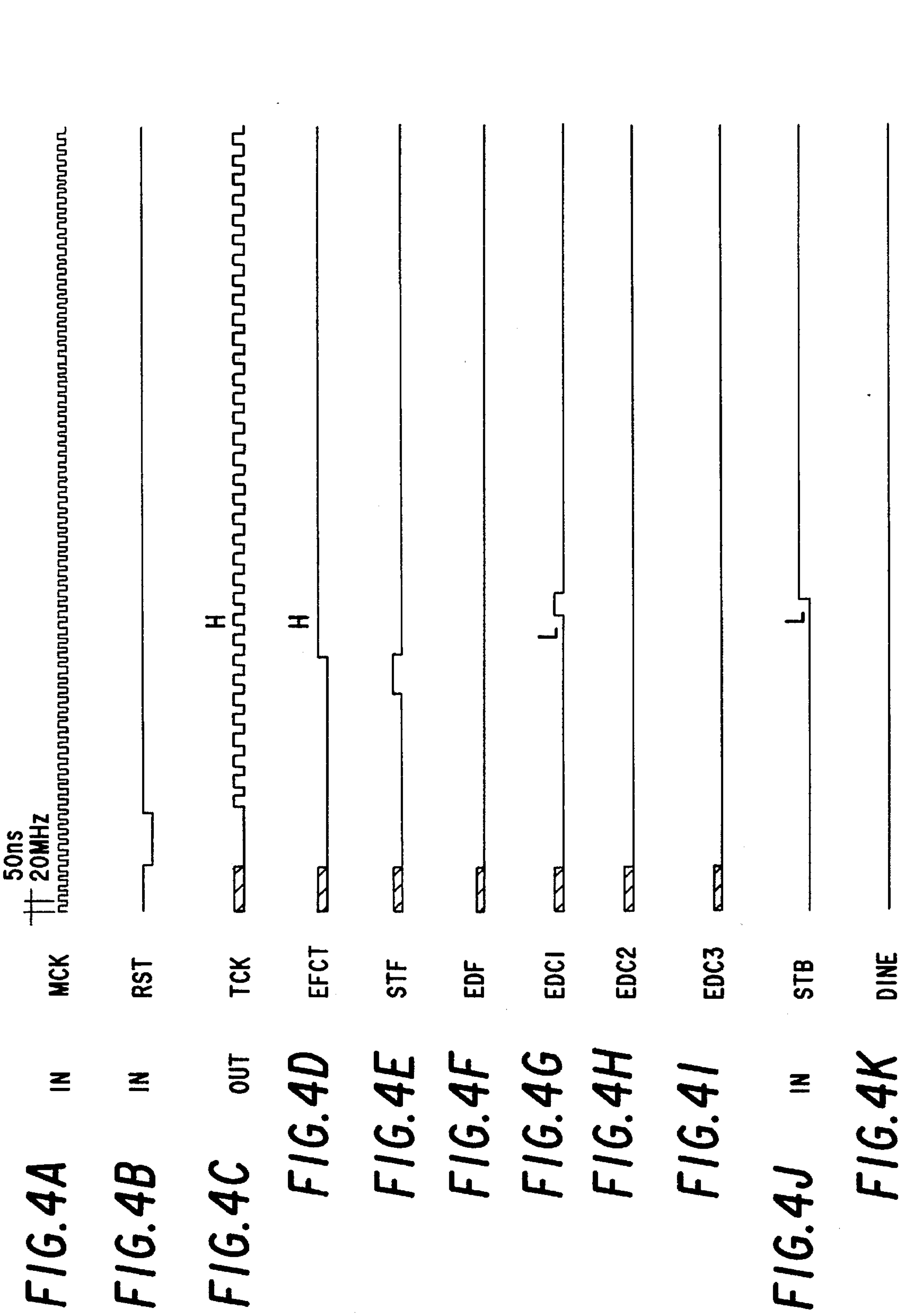
50ns
20MHz
FIG.4A IN MCK
FIG.4B IN RST
FIG.4C OUT TCK
FIG.4D EFCT
FIG.4E STF
FIG.4F EDF
FIG.4G EDC1
FIG.4H EDC2
FIG.4I EDC3
FIG.4J IN STB
FIG.4K DINE
H
H
L
L

FIG.4L IN
DCK

SDCK

SMP
FIG.4O IN
DAT

SDA1

SDA2

SDA3

HALF

LONG
H
L
t1 t2 t3 t4 t5 t6 t7 t8 t9
b1 b2 b3

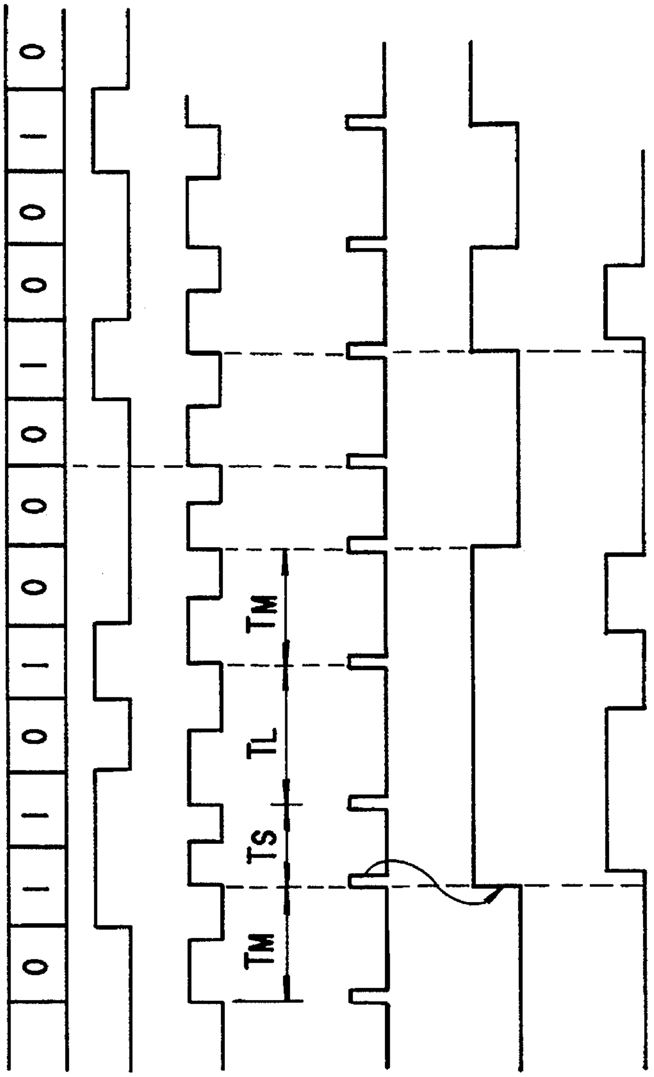
FIG.5A DATA
FIG.5B TXD
FIG.5C MODULATED SIGNAL
FIG.5D EDGED SIGNAL
FIG.5E EDGE TOGGLE SIGNAL MTGL
FIG.5F RXD

DIGITAL DATA MODULATING METHOD

BACKGROUND OF THE INVENTION

1. Field of the Invention

The present invention relates to a digital data modulating method in the digital communication.

2. Description of Related Art

There are two different modulating systems in the digital communication, that is, an FSK system and an FM system.

As seen from FIG. 6, in the FSK system pieces of data information representing logic "1"s are converted into signals of high-frequency $f_H$ whereas pieces of data information representing logic "0"s are converted into signals of low-frequency $f_L$.

As seen from FIG. 7, in the FM system pieces of data information representing logic "1"s are represented by frequency-modulated signals of frequency 2*f* whereas pieces of data information representing logic "0"s are represented by frequency-modulated signals of frequency if. In FIG. 7 clock pulses and data pulses are indicated by C and D respectively.

The FSK system has a demerit of preventing its communication rate from increasing beyond a predetermined limit. The FM system has a demerit of the duty ratios of the modulated signals being sensitive to noise signals appearing in communication mediums, thereby often preventing required communications.

In view of these there has been an ever increasing demand for a digital data modulating method guaranteed free of distortion of duty ratio caused by noise signals appearing in communication mediums, thus assuring the stable communication, and permitting required demodulation of modulated signals even if their duty ratios are disturbed, and permitting the increasing of the communication rate.

SUMMARY OF THE INVENTION

To meet these demands a digital data modulating method according to the present invention comprises the steps of: dividing a series of binary bits in groups or combinations, each including at least three binary bits; and allotting each of the sequential groups or combinations to a corresponding period-and-phase discriminating signal, thereby providing a series of different single-period signals representing a given digital data.

The period-and-phase discriminating signals allotted to the three sequential digital data bit combinations may have a period $T_S$, $T_M$ or $T_L$ equal to the bit cell width $t_b$, 1.5 $t_b$ or 2.0 $t_b$. The digital data may be related with the period-and-phase discriminating signals as follows: if the three sequential digital data bit combination ($b_1$, $b_{i+1}$ and $b_{1+2}$) H L, L and L, it is allotted to a first period-and-phase discriminating signal having a short period $T_s$, appearing synchronous with the leading end S of the intermediate bit $b_{i+1}$; if the three sequential digital data bit combination ($b_1$, $b_{i+1}$ and $b_{1+2}$) is L, L and H, it is allotted to a second period-and-phase discriminating signal having an intermediate period $T_M$, appearing synchronous with the leading end S of the intermediate bit $b_{i+1}$; if the three sequential digital data bit combination ($b_i$, $b_{i+1}$ and $b_{i+2}$) is tI, L and L, it is allotted to a third period-and-phase discriminating signal having an intermediate period $T_M$, appearing synchronous with the intermediate point C of the leading bit $b_i$; if the three sequential digital data bit combination ($b_i$, $b_{i+1}$ and $b_{i+2}$) is H, L and H, it is allotted to a fourth period-and-phase discriminating signal having a long period $T_L$, appearing synchronous with the intermediate point C of the leading bit $b_i$; if the three sequential digital data bit combination ($b_i$, $b_{i+1}$ and $b_{i+2}$) is H, H and -, it is allotted to a fifth period-and-phase discriminating signal having a short period $T_S$, appearing synchronous with the intermediate point C of the leading bit $b_i$, where L and H stand for binary code signals "0" and "1", and - stands for either binary code signal.

The principle of the digital data modulating method according to the present invention is: each of at least three sequential digital data binary bit combinations (a sequence of N binary digits) is allotted to a corresponding period-and-phase discriminating signal; sampling at least three digital bits from the input digital data signal composed of series of binary digits; outputting a period-and-phase discriminating signal which is allotted to the so sampled digital bits in group or combination at every occurrence; repeating these at the end of the single period of each corresponding period-and-phase discriminating signal.

In case of sampling three sequential digital data bits (000; 001; 010; 011; 100; 101; 110 and 111) in groups or combinations one after another, these groups are allotted to six individual single-period signals having three different periods which are as long as the width of the data bit cell, 1.5 times longer than the width of the data bit cell, and 2 times longer than the width of the data bit cell, and two different phases starting synchronously with the leading edge of a selected data bit cell and with the intermediate point of another selected data bit cell.

A signal thus modulated with a given digital data is composed of a sequence of different single-period signals, thereby eliminating the possibility of disturbance of their periods even if their duty ratios should be disturbed by noise signals appearing in communication mediums.

Other objects and advantages of the present invention will be understood from the following description of preferred embodiments of the present invention, which are shown in accompanying drawings.

BRIEF DESCRIPTION OF THE DRAWINGS

FIG. 2 shows tile waveforms of a digital data signal and a signal modulated therewith;

FIG. 5 is a time chart of different waveforms, showing how a required signal modulation is effected;

DESCRIPTION OF THE PREFERRED EMBODIMENTS

A digital data modulating method according to the present invention is described as being applied to a wireless image scanner using an infrared ray.

A modulator on the transmitter side is so constructed as to function according to the following algorithm to output a signal modulated with a given input digital data signal according to the present invention. Hereinafter, the highlevel binary digit (or logic "1") of the input digital data signal is indicated by "H", whereas the low-level binary digit (or logic "0") of the input digital data signal is indicated by "L".

Figures 4M, 4N, 4P, 4Q, 4R, 4S, 4T:
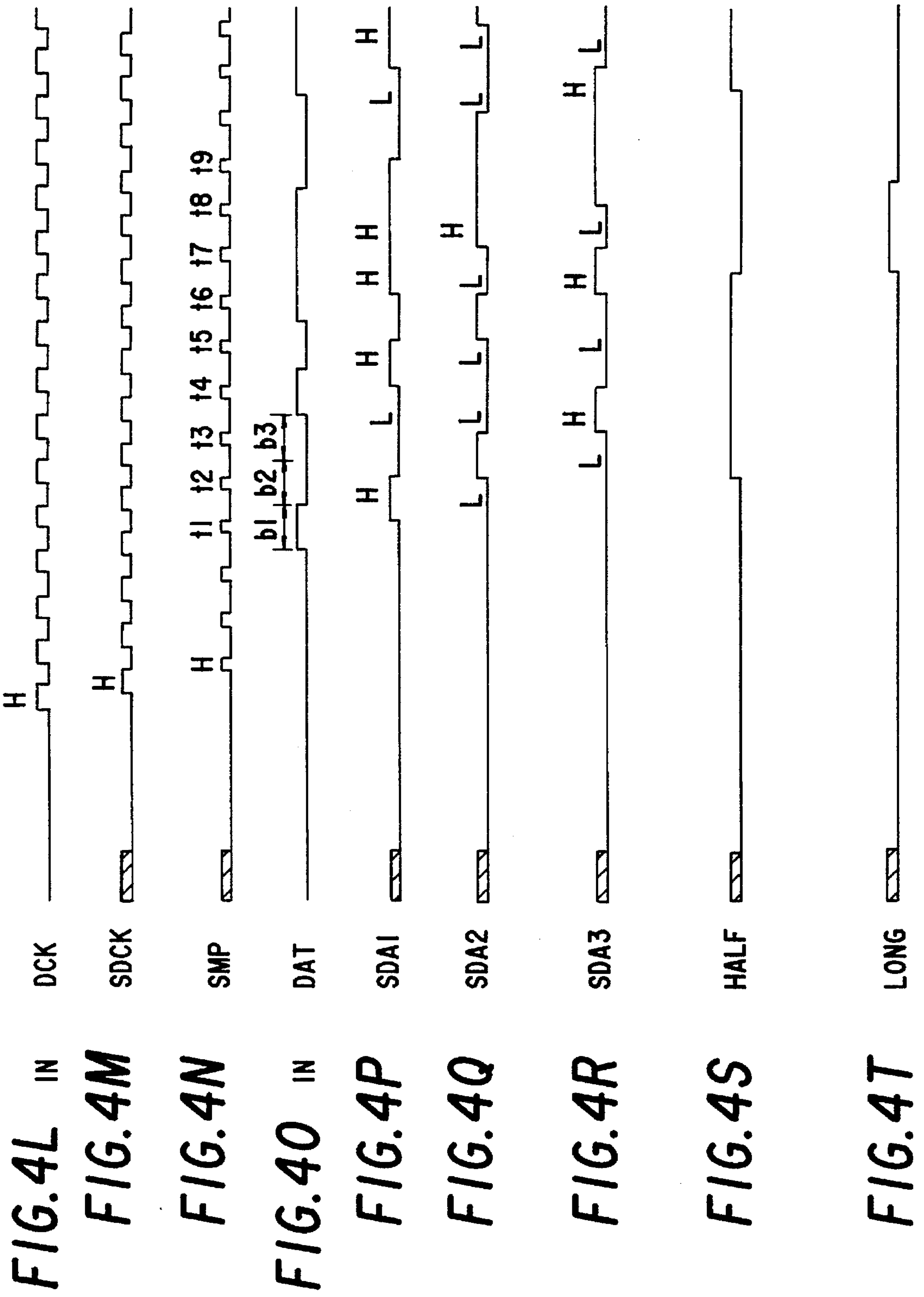
FIG. 4 is a time chart of different waveforms appearing at different terminals of the modulator circuit.
Figures 1, 4B, 4U, 4V, 4W, 4X, 4Y, 4Z:
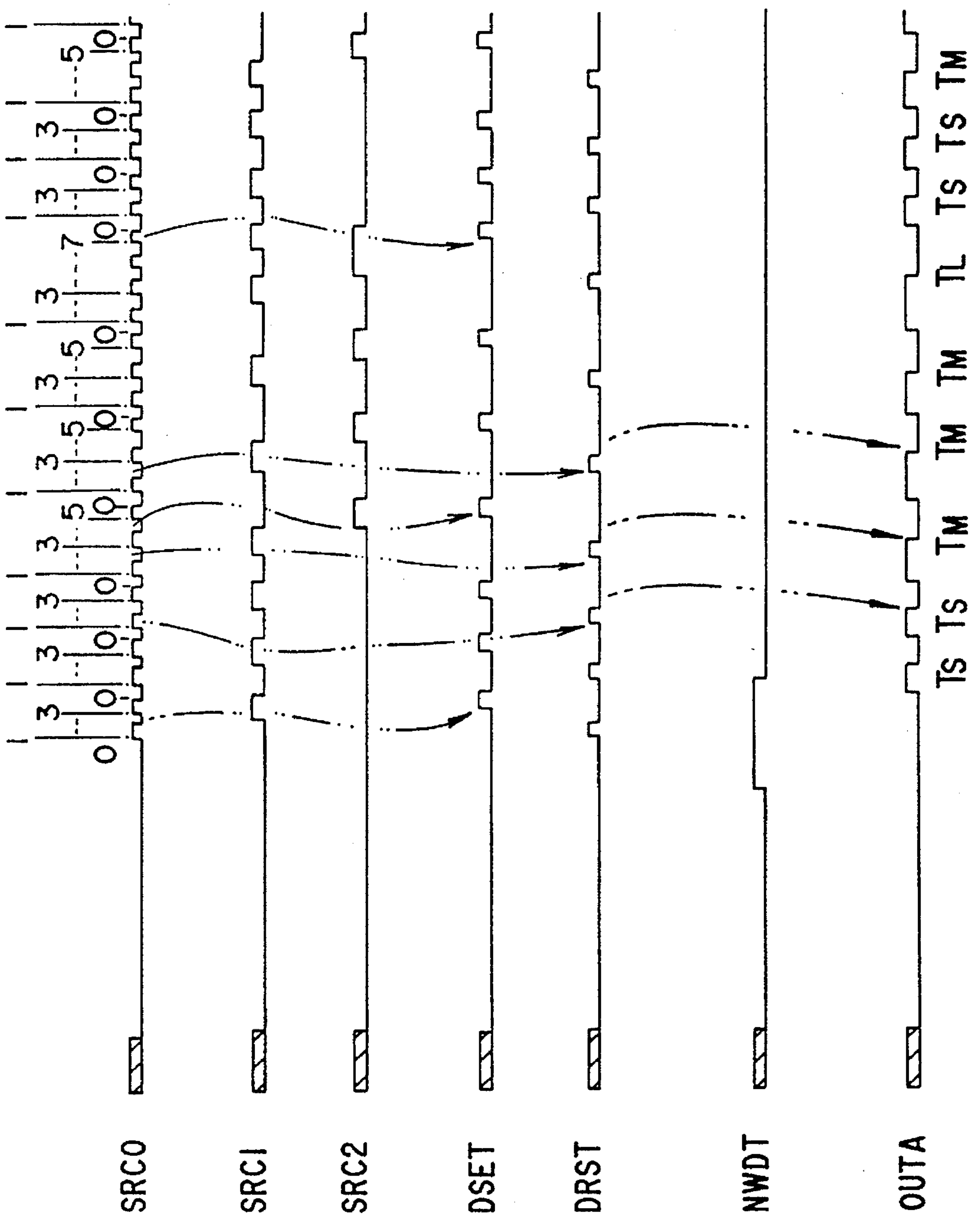
FIG. 1 shows one example of providing signals modulated with a given digital data signal.
Figures 6A, 6B, 7A, 7B, 7C:
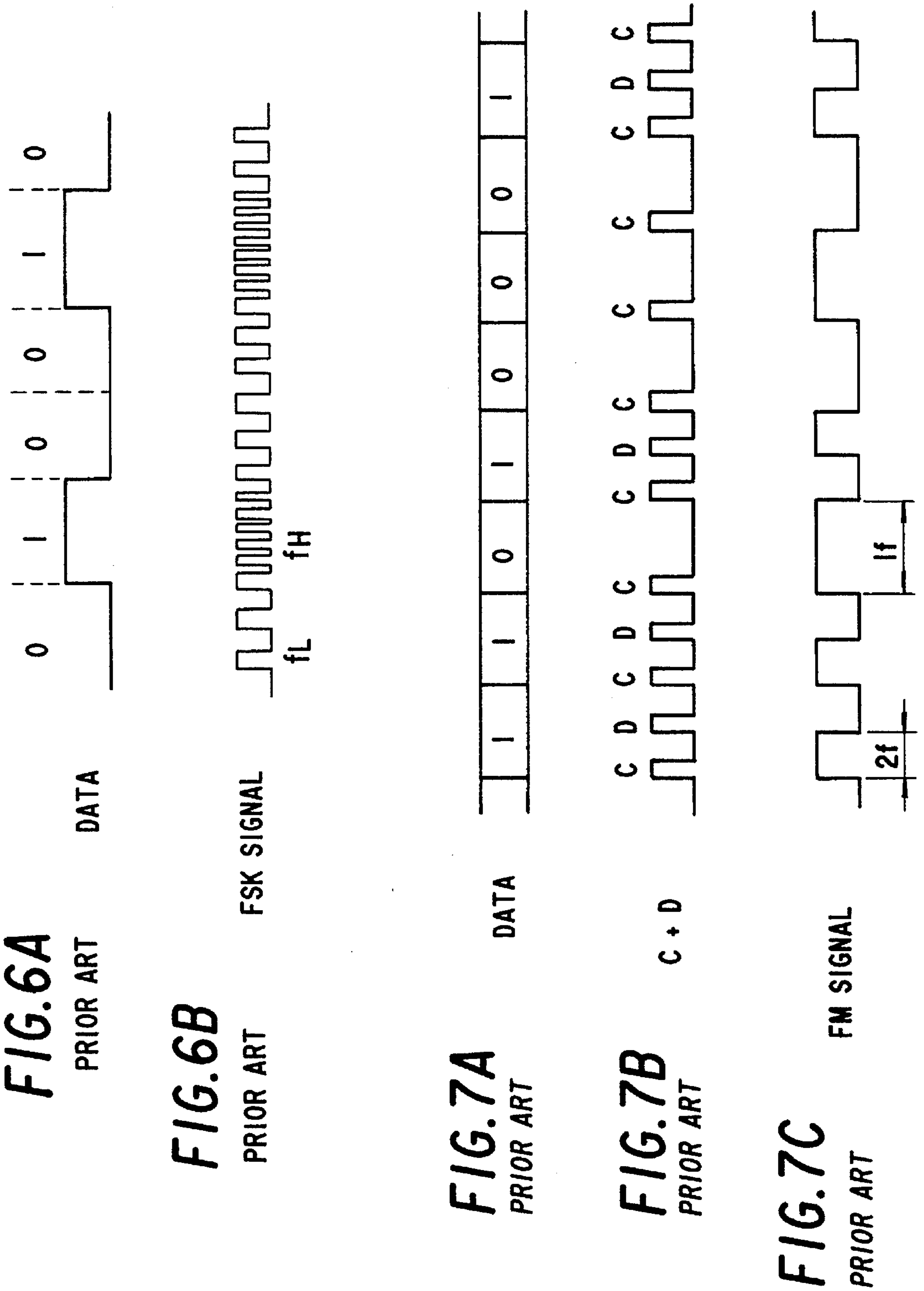
FIG.6A PRIOR ART
FIG.6B PRIOR ART
FIG.7A PRIOR ART
FIG.7B PRIOR ART
FIG.7C PRIOR ART
FIG. 6 is a time chart of waveforms, showing how a conventional FSK modulation is effected.
FIG. 7 is a time chart of waveforms, showing how a conventional FM modulation is effected.

The modulator allots each of three-bit combinations ($b_i$, $b_{i+1}$ and $b_{i+2}$) given in terms of H and L to a corresponding period-and-phase discriminating signal, each distinguishable in terms of period T and phase or starting point SP of each single-period signal as shown in FIG. 1. Specifically the periods T are a short-period $T_s$ (=$t_b$), an intermediate-period $T_M$ (=1.5 $t_b$), and a long-period $T_L$ (=2.0 $t_b$). The letter, "S" of the starting point SP in FIG. 1 indicates the leading end position of a selected bit cell whereas the letter "C" indicates the tailing end position of another selected bit cell. The symbol, "-" represents H or L.

The modulator is so designed that a single-period signal corresponding to one of tile different bit-combinations or groups each including three bit cells $b_i$, $b_{i+1}$ and $b_{i+2}$ may be provided for the single period starting from the starting point SP.

Assume that the three binary digits $b_i$, $b_{i+1}$ and $b_{i+2}$ are L, L and L, a single-period signal of short period $T_s$ appears with its leading edge rising at the leading edge position S of the bit cell $b_{i+1}$. Assume that the three binary digits $b_i$, $b_{i+1}$ and $b_{i+2}$ are H, L and L, a single-period signal of intermediate period $T_M$ appears with its leading edge rising at the intermediate position C of the bit cell $b_i$.

Combinations L, H and L and L, H and H which do not appear in FIG. 1 are represented by L, tI and H and H, H and -, respectively.

Modulation is effected according to the transforming relationship just described as follows:

Referring to FIG. 2, the data signal is applied to the modulator, and as shown, it has a start bit "0" (or "L") appearing ahead of the series of significant bits.

Three bits arranged with the start bit at the center of the first group are L, L and H, and therefore, a corresponding period-and-phase discriminating signal has an intermediate period $T_M$ starting from the leading edge of the start bit "0".

The bit cell appearing at the end of the single intermediate period $T_M$ is selected as tile bit cell $b_i$, and then, the subsequent three bit cells $b_i$,$b_{i+1}$ and $b_{i+2}$ are H, L and H, which series is converted to a single-period signal having a long period $T_L$ and starting from the intermediate position C of the bit cell $b_i$.

The data bit $b_{i+2}$ of the precedent 3 bit-combination still exists at the end of the single period $T_L$, and it is selected as bit cell $b_i$ in the subsequent 3 bit-combination. Then, the consecutive three bit cells are H, H and L, which bit group is converted to a single-period signal of short period $T_s$ starting from the intermediate of the bit cell $b_i$.

Likewise, the data bit which still exists at the end of the single period $T_s$ is selected as bit cell $b_i$ in the subsequent combination, and then, the consecutive three bit cells are H, L and L, which bit group is converted to a single-period signal of intermediate period $T_M$ starting from the intermediate of the bit cell $b_i$.

Similarly, the consecutive series of three-bit groups are composed by selecting the bit cell existing at each end of the period as the first bit cell $b_i$ in tile subsequent group, and the so composed groups are converted one after another to corresponding single-period signals at each end of the antecedent single period.

Thus, the modulated signal results as shown in FIG. 2. As seen from the drawing, the modulated signal is a train of pulses each defined in terms of definite period, thus guaranteed free of any disturbance which otherwise, would be caused by noise signals appearing in communication mediums.

Also, it should be noted that required modulation is finished in the same length of time as the digital data signal lasts, and therefore, such modulation is appropriate for highspeed data transmission.

Figure 3:
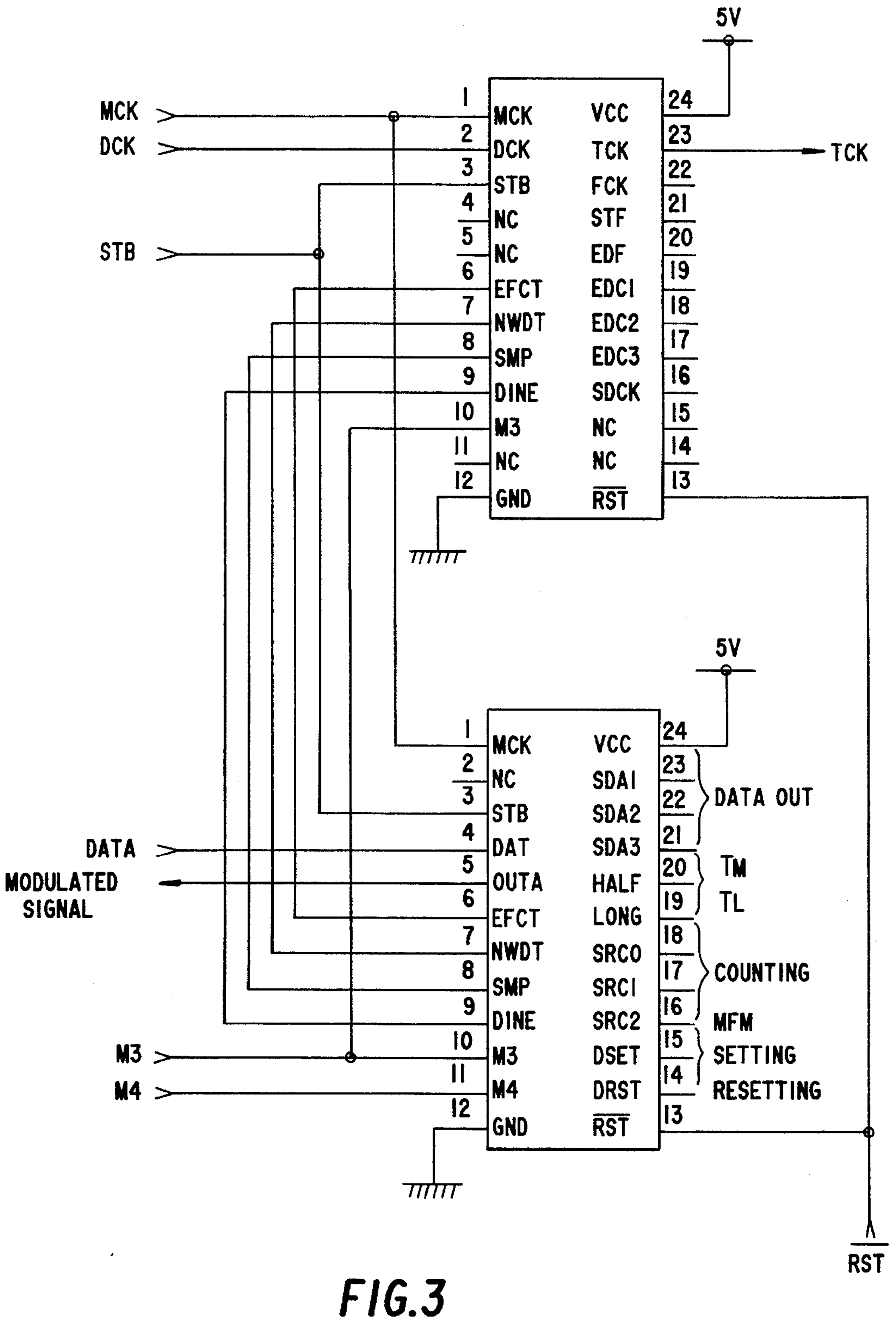
FIG. 3 is a modulator circuit diagram according to one embodiment of the present invention.

Referring to FIG. 3, a modulator which is designed to provide a signal modulated with digital data bits according to the present invention. The modulator uses two programmable integrated circuits in combination, which comprises data inlet section, period determinating section, counter section, periodstart setting section and modulated signal outputting section.

Master clock signal MCK (For instance, 20 MHz), reset signal RST, modulation effective extent setting signal EFCT and stand-by signal representative of the inputting of data are applied to these sections of the modulator.

Referring to FIG. 3 and Tables 1 to 5, the functions of these sections of the modulator are described below.

(1) Data Inlet Section:

The data inlet section is composed of parts to which input the data signal DAT is applied, and which parts are capable of parallel-converting the data signal to the output data signals SDA1, SDA2 and SDA3. As seen from Table 1, when the reset signal RST turns high (H), the master clock signal MCK is applied to the modulator, and at the same time, the stand-by signal STB turns high (H), putting the modulator in the stand-by condition.

TABLE 1

(DAT Inlet)

| IN | | | | | | | | | | OUT | | |
|---|---|---|---|---|---|---|---|---|---|---|---|---|
| | | | | Feedback | | | | | | | | |
| $\overline{RST}$ | MCK | STB | DAT | EFCT | DINE | SMP | SDA1 | SDA2 | SDA3 | SDA1 | SDA2 | SDA3 |
| L | | | | | | | | | | L | L | L |
| | ↑ | H | H | H | L | H | | | | H | | |
| | ↑ | | | H | L | L | H | | | H | | |
| | ↑ | | | H | L | H | H | | | | H | |
| | ↑ | | | H | L | L | | H | | | H | |
| | ↑ | | | H | L | H | | H | | | | H |
| | ↑ | | | H | L | L | | | H | | | H |

The data inlet section is capable of: accepting the input data signal DAT having a bit duration or width $t_b$; sampling the input data signal DAT by the sampling signal SMP at each interval of $t_b$; and outputting three output data signals SDA1, SDA2 and SDA3.

Specifically, when the input data signal DAT is applied to the modulator, required sampling is effected with the aid of the sampling signal SMP whose period is equal to the bit cell width $t_b$.

When the input data signal DAT turns H, the output data signal SDA1 is H as a result of the sampling by the first sampling signal SMP. Then, the output data signal SDA1 is fed-back to the input terminal, and then the output data signal SDA2 is H as a result of the sampling by the second sampling signal SMP. Then, the output data signal SDA1 is L.

The output data signal SDA2 is fed-back to the input terminal, and then the output data signal SDA3 is H as a result of the sampling by the third sampling signal SMP. Then, the output data signal SDA2 is L. Thus, the output data signals SDA1, SDA2 and SDA3 have the same shape as the input data signal DAT sequentially delayed by the time $t_b$.

The logic values each of the output data signals SDA1, SDA2 and SDA3 are stored in an appropriate latch device, and they are Fed-back to the input terminal at a subsequent sampling time.

(2) Period Determining Section:

The period determining section is composed of parts which are designed to provide the output, intermediate period signal HALF and the output, long period signal LONG. As seen from Table 2, it is capable of providing the output, intermediate period signal HALF for setting a single intermediate period on a signal to be modulated, and the output, long period signal LONG For setting a single long period on the signal to be modulated, based on the logic levels of tile output data signals SDA1, SDA2 and SDA3.

TABLE 2

(Intermediate (HALF) and long periods (LONG) setting)

| IN | | | | | | | | | OUT | |
|---|---|---|---|---|---|---|---|---|---|---|
| | | Feedback | | | | | | | | |
| $\overline{RST}$ | MCK | EFCT | SDA1 | SDA2 | SDA3 | DSET | HALF | LONG | HALF | LONG |
| L | | | | | | | | | L | L |
| ↑ | | H | H | L | L | H | | | H | |
| | ↑ | H | L | L | H | H | | | H | |
| | ↑ | H | | | | L | H | | H | |
| | ↑ | H | H | L | H | H | | | | H |
| | ↑ | H | | | | L | | H | | H |

When the logic values of the output data signals SDA1, SDA2 and SDA3 are H, L and L, and L, L and H, the output intermediate period signal HALF rises to H. While the intermediate period signal HALF remains at H, the output intermediate period $T_M$ is applied to the signal to be modulated.

When the logic values of the output data signals SDA1, SDA2 and SDA3 are H, L and H, the output long period signal LONG rises to H. While the output long period signal $T_L$ remains at H, the long period $T_L$ is applied to the signal to be modulated. While the output intermediate and long period signals HALF and LONG are L, the short period $T_s$ is applied to the signal to be modulated.

The output intermediate and long period signals HALF and LONG are fed-back to the input terminal of the period determining section upon appearance at the output terminal.

(3) Counters:

Counters are designed to provide count signals SRC0, SRC1 and SRC2. As seen from Table 3, these counters are binary counters (0 to 7). When the significant data signal EFCT is H, the counters count one for each period of master clock signal MCK, thus providing tile count signals SRC0, SRC1 and SRC2.

TABLE 3

(Resetting counter)

| IN | | | | | | | OUT | | |
|---|---|---|---|---|---|---|---|---|---|
| | | Feedback | | | | | | | |
| $\overline{RST}$ | MCK | EFCT | DSET | SRC0 | SRC1 | SRC2 | SRC0 | SRC1 | LONG |
| L | | | | | | | L | L | L |
| | ↑ | H | L | L | | | H | | |
| | ↑ | H | L | H | L | | | H | |
| | ↑ | H | L | L | H | | | H | |
| | ↑ | H | L | H | H | L | | | H |
| | ↑ | H | L | | L | H | | | H |
| | ↑ | H | L | L | | H | | | H |

The binary count signals SRC0, SRC1 and SRC2 represent the least, intermediate and most significant digits respectively. These count signals are fed-back to the input terminal when appearing at the output terminals thereof.

(4) Period-Start Setting Section:

The period-start setting section is designed to provide a data setting signal DSET for setting the start point of each period in a modulated signal, and a data resetting signal RST for setting the intermediate point of the period on the basis of the condition of each of tile output intermediate period signal HALF, the output long period signal LONG, and the count signals SRC0, SRC1 and SRC2.

(5) Modulated Signal Outputting Section:

The modulated signal outputting section is designed to provide a modulated signal OUTA on the basis of the data setting signal DSET and the data resetting signal DRST as seen from Table 5. Specifically, the modulated signal OUTA has a period rising synchronously with tile descent of the data setting signal DSET and descending synchronously with the descent of the data resetting signal DRST.

TABLE 4

(Reset signal provided)

| IN | | | | | | | | | OUT | |
|---|---|---|---|---|---|---|---|---|---|---|
| | | Feedback | | | | | | | | |
| $\overline{RST}$ | MCK | EFCT | HALF | LONG | SRC0 | SRC1 | SRC2 | Count | DSET | DRST |
| L | | | | | | | | | L | L |
| | ↑ | H | L | L | L | H | L | 2 | H | |
| | ↑ | H | H | | L | L | H | 4 | H | |
| | ↑ | H | | H | L | H | H | 6 | H | |
| | ↑ | H | L | L | L | L | L | 0 | | H |
| | ↑ | H | H | | H | L | L | 1 | | H |
| | ↑ | H | | H | L | H | L | 2 | | H |

When the output intermediate period signal HALF and the output long period signal LONG are L, that is when the short period $T_s$ is to be applied, the data setting signal DSET will be upon the count of 2.

When the output intermediate period signal HALF is H (that is, when the intermediate period $T_M$ is to be applied), the data setting signal DSET will be H upon the count of 4.

When the output long period signal LONG is tt (that is, when the long period $T_L$ is to be applied), the data setting signal DSET will be H upon the count of 6.

The data reset signal DRST will be H upon the count of 0, provided that the output intermediate period signal HALF and the output long period signal LONG are L (the short period $T_s$).

When the output intermediate period signal HALF is H (the intermediate period applied), the data resetting signal DRST will be H upon the count of 1.

When the output long period signal LONG is H (the long period applied), the data resetting signal DRST will be H upon the count of 2.

TABLE 5

(modulated signal provided)

| IN | | | | | | |
|---|---|---|---|---|---|---|
| | | Feedback | | | | |
| $\overline{RST}$ | MCK | EFCT | DSET | DRST | OUTA | OUT |
| L | | | | | | L |
| | ↑ | H | H | | L | H |
| | ↑ | H | | L | H | H |

Referring to FIG. 4, the operation of the modulator according to the above described algorithm is described below.

Modulation starts when the data effective signal EFCT is H, permitting the starting of counting operation. The sampling of the input data signal DAT by the sampling signal SMP starts, thus outputting the sampled data signals SDA1, SDA2 and SDA3 from the data inlet section at the time interval of $t_b$.

The output intermediate period signal HALF and the output long period signal LONG are L until the logic values of the output data signals SDA1, SDA2 and SDA3 have become H, L and L, and the while the counters repeated the count of "0123", and the data setting signal DSET rises at the count of 2, and descends at the count of 3.

On the other hand, the data resetting signal DRST rises at the count of 0, and descends at the count of 1 repeatedly. Therefore, the modulated signal has a short period $T_s$ until the logic values of the output data signals SDA1, SDA2 and SDA3 have become H, L and L.

When the input data signal PAT is H at its bit cell $b_1$, the output data signal SDA1 is H at the intermediate point of the bit cell $b_1$ on the timing $t_1$ of the sampling signal SMP. Next, the output data signal SDA2 is H on the timing $t_2$ of the sampling signal SMP, and the output data signal SDA3 is H on the timing $t_3$ of the sampling signal SMP.

The logic values of the output data signals SDA1, SDA2 and SPA3 are H, L and I, on the timing $t_2$, and as a result the output intermediate period signal HALF is H. When the output intermediate period signal HALF is H, the data setting signal DSET rises at the count of 4, and descends at the count of 5. On the other hand, the data resetting signal DRST rises at the count of 1, and descends at the count of 2. As a result the modulated signal has an intermediate period $T_M$ (=1.5 $t_b$).

At the end of the single intermediate period $T_M$ the logic values of the sampled data are checked to find L, L and H, and therefore, the intermediate period $T_M$ is applied, too, which intermediate period $T_M$ is consecutive to the following intermediate period $T_M$. Thus, the intermediate period $T_M$ appears three times in succession.

When the subsequent three intermediate periods $T_M$ are finished between times $t_6$ and $t_7$, the logic values of the output data signals SDA1, SPA2 and SDA3 are H, L and H, and as a result tile output intermediate period signal HALF is L, and the output long period signal LONG is H.

When the output long period signal LONG is H, the pulse-to-pulse interval of the data setting signal DSET is as long as the count of 6, and as a result tile modulated signal has a long period $T_L$ (=2.0×$t_b$). This single long period $T_L$ ends between times $t_8$ and $t_9$.

At this moment the logic values of the sampled data are H, H and H, and therefore, the output long period signal LONG descends. As a result the output intermediate signal HALF and the output long period signal LONG are L, and therefore, the modulated signal comes to have a short period $T_s$.

Likewise, the logic values of the sampled data at the end of each period permits determination as to how long the subsequent single period is, and the single-periods of the modulated signal are determined accordingly.

The modulated signal on the transmitter side is demodulated on the receiver side according to the reversed process of modulation as follows:

First, the edge signals are formed to indicate the rising edge of each pulse of the modulated signal on the receiver side, as seen from FIG. 5. These edge signals correspond to the data setting signals DSET in the modulator. From these edge signals the kinds ($T_s$, $T_M$ and $T_L$) of each period in the modulated signal are identified. At the same time an edge toggle signal MTGL is made by the edge signal appearing at the end of each intermediate period $T_M$.

Next, a demodulated signal RXD is formed by the edge toggle signal MTGL and the periods of the modulated signal according to the conditions given in Table 6 as follows.

TABLE 6

| IN | | | |
|---|---|---|---|
| | Feedback | | OUT |
| T | MTGL | R x D | R x D |
| | H | L | H |
| Ts | | H | H |

As may be understood from the above, a digital data modulating method according to the present invention provides a modulated signal in the form of a series of single-periods, which modulated signal can be demodulated stable even if its duty ratios are disturbed by communication mediums. Also, it permits modulation appropriate for a high-speed data communication, which is insensitive to noise signals appearing in communication mediums.

I claim:

1. A digital data modulating method comprising the steps of:

dividing a series of binary bits into groups of at least three binary bits: and allotting each of the sequential group to a corresponding predetermined period-and-phase discriminating signal, therein providing a series of different period-and-phase discriminating signals representing a given digital data wherein the digital data is related with the period-and-phase discriminating signals as follows:

if the three sequential digital data bit combination ($b_1$, $b_{1+1}$ and $b_{1+2}$) is L, L and L, it is allotted to a first period-and-phase discriminating signal having a short period $T_s$, appearing synchronous with the leading end S of the intermediate bit $b_{1+1}$;

if the three sequential digital data bit combination ($b_1$, $b_{1+1}$ and $b_{1+2}$) is L, L and H, it is allotted to a second period-and-phase discriminating signal having an intermediate period $T_M$, appearing synchronous with the leading end S of the intermediate bit $b_{1+1}$;

if the three sequential digital data bit combination ($b_1$, $b_{1+1}$ and $b_{1+2}$) is H, L and L, it is allotted to a third period-and-phase discriminating signal having an intermediate period $T_M$, appearing synchronous with the intermediate point C of the leading bit $b_1$;

if the three sequential digital data bit combination ($b_1$, $b_{1+1}$ and $b_{1+2}$) is H, L and H, it is allotted to a fourth period-and-phase discriminating signal having a long period $T_L$, appearing synchronous with the intermediate point C of the leading bit $b_1$;

if the three sequential digital data bit combination ($b_1$, $b_{1+1}$ and $b_{1+2}$) is H, H and -, it is allotted to a fifth period-and-phase discriminating signal having a short period $T_s$, appearing synchronous with the intermediate point C of the leading bit $b_1$, where L and H stand for binary digits "0" and "1", and - stands for either binary digit.

2. A digital data modulating method according to claim 1, wherein each of the period-and-phase discriminating signals allotted to the three sequential digital data bit combinations has a period $T_s$, $T_M$ or $T_L$ equal to the bit ceil width $t_b$, 1.5 $t_b$ or 2.0 $t_b$.

* * * * *